(12) United States Patent
Sidorin

(10) Patent No.: US 6,947,453 B2
(45) Date of Patent: Sep. 20, 2005

(54) TUNABLE DIFFRACTIVE DEVICE

(75) Inventor: Yakov Sidorin, Tucson, AZ (US)

(73) Assignee: Optitune plc, London (GB)

( * ) Notice: Subject to any disclaimer, the term of this patent is extended or adjusted under 35 U.S.C. 154(b) by 0 days.

(21) Appl. No.: 10/046,914

(22) Filed: Jan. 17, 2002

(65) Prior Publication Data

US 2003/0133478 A1 Jul. 17, 2003

(51) Int. Cl.$^7$ ................................................ H01S 3/10
(52) U.S. Cl. ............................ 372/20; 372/96; 372/102
(58) Field of Search .......................... 372/20, 96, 102, 372/43–50

(56) References Cited

U.S. PATENT DOCUMENTS

| | | | | |
|---|---|---|---|---|
| 3,631,360 A | * | 12/1971 | Lehovec | 250/552 |
| 3,653,742 A | * | 4/1972 | Buchan | 359/254 |
| 3,961,188 A | * | 6/1976 | Barrett | 250/303 |
| 5,301,201 A | | 4/1994 | Dutta et al. | |
| 5,357,591 A | | 10/1994 | Jiang et al. | |
| 5,434,426 A | * | 7/1995 | Furuyama et al. | 250/551 |
| 5,488,681 A | * | 1/1996 | Deacon et al. | 385/37 |
| 5,680,233 A | * | 10/1997 | Faris et al. | 349/61 |
| 6,045,208 A | * | 4/2000 | Hirahara et al. | 347/10 |
| 6,215,928 B1 | | 4/2001 | Friesem et al. | |
| 6,219,478 B1 | | 4/2001 | Parriaux et al. | |
| 6,252,647 B1 | * | 6/2001 | Shiraishi | 355/53 |
| RE37,809 E | * | 7/2002 | Deacon et al. | 372/102 |

FOREIGN PATENT DOCUMENTS

EP  0614255 A1  9/1994

OTHER PUBLICATIONS

Cassidy et al, "Diffractive Optical Element Used in an External Feedback Configuration to Tune the Wavelength of Uncoated Fabry–Perot Diode Lasers", Journal of Modern Optics, 1999, vol. 46, No. 7, pp. 1071–1078.

Tanaka et al, "Intracavity Optical Modulation Using Fresnel Zone–Plate Type E–O Lens", Proceedings SPIE (International Society for Optical Engineering)—Integrated Optics Devices III, Mar. 1999, vol. 3620, pp. 38–44.

Hamp et al, "Diffractive Optical Element External Cavity Diode Laser", Technical Digest, Summaries of Papers Presented at the Conference on Lasers and Electro–Optics, Postconference Edition, CLEO '99, Conference on Lasers and Electro–Optics (IEEE Cat. No. 99CH37013), Technical Digest, p. 154, xp002226405.

* cited by examiner

Primary Examiner—Min Sun Harvey
Assistant Examiner—Delma R. Flores Ruiz
(74) Attorney, Agent, or Firm—Nixon & Vanderhye P.C.

(57) ABSTRACT

In a tunable optical source, a zone plate device 100 is used to provide frequency selective feedback to a laser diode 110. The zone plate device 100 is positioned to receive an output mode of the laser diode 110 and to return a frequency selected image of the mode spot to the laser diode 110. By changing the refractive index of material of the zone plate device 100, it is possible to change the frequency providing the image at the point of return to the laser diode 110. This allows the zone plate device 100 to be used in tuning the optical source, without using moving parts. In an embodiment, the zone plate device 100 is at least partially fabricated in an electro-optic material such as SBN:75 and can therefore be tuned by using electrodes to apply an elecric field across it. The zone plate device 100 can be coupled directly to the laser diode 110 or via a waveguide section 105 which can be used to increase the output mode spot size from the laser diode 110 for delivery to the zone plate device 100. The zone plate device 100 can alternatively be used as a standalone component for filtering optical radiation from other sources. Tunable optical sources can be used for instance in communications, particularly wavelength division multiplexing.

36 Claims, 9 Drawing Sheets

FIGURE 16
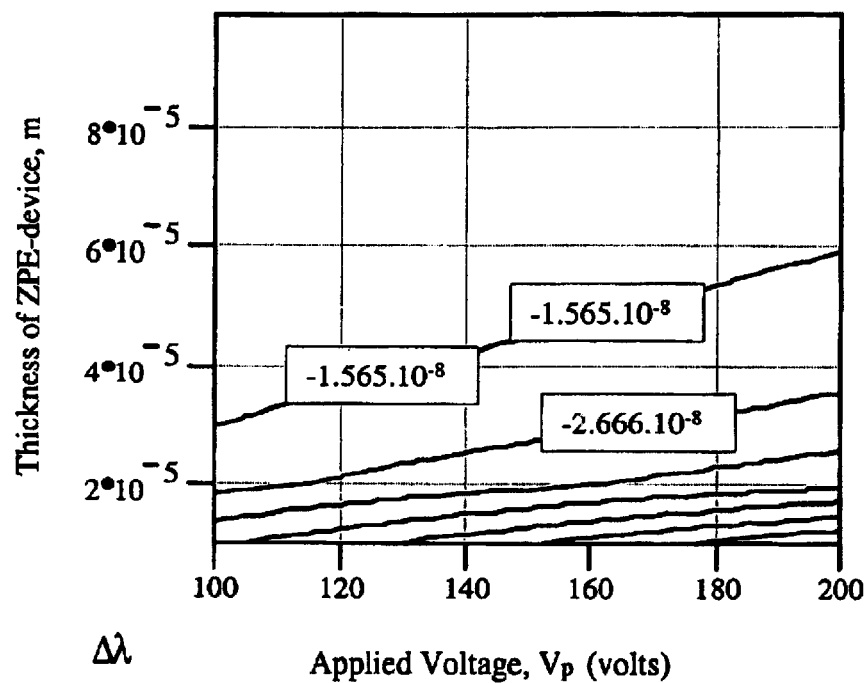
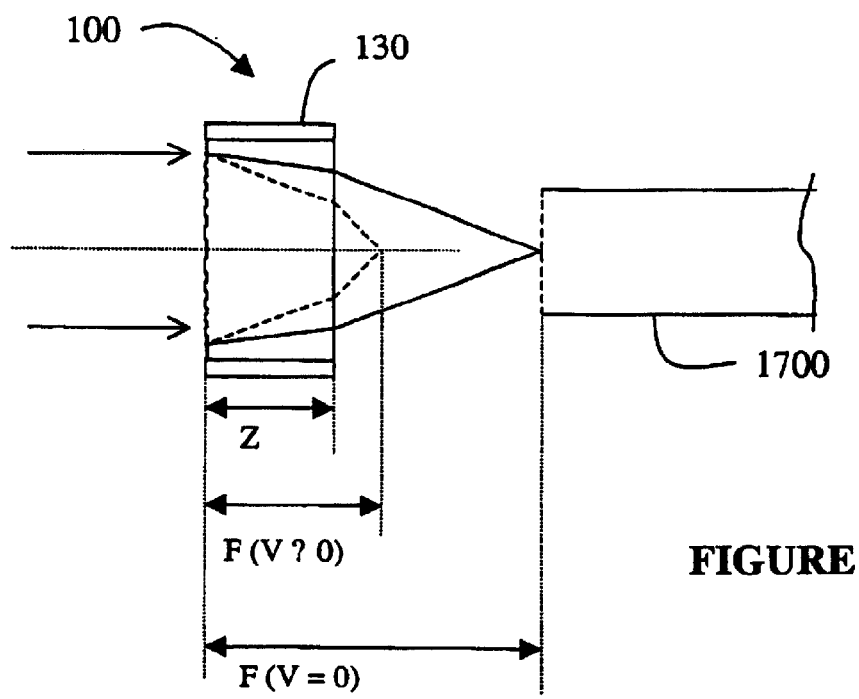
FIGURE 17

TUNABLE DIFFRACTIVE DEVICE

TECHNICAL FIELD OF THE INVENTION

The present invention relates to a tunable diffractive device. It finds particular application in optical filtering or switching.

BACKGROUND

Semiconductor laser diodes are known as optical sources. Various techniques are used to obtain single mode, narrow linewidth operation which is desirable in applications such as communications. For instance, unmodified edge emitting laser diodes typically operate with several longitudinal modes lasing simultaneously, leading to low coherence and large linewidths. A technique known for use with edge emitting laser diodes is to use a grating to act as a wavelength filter in providing feedback to the lasing cavity to obtain single mode operation and a linewidth centred on a wavelength selected by the grating. Examples are the distributed feedback (DFB) and distributed Bragg reflector (DBR) lasers in which a grating extends at least partially along the length of the lasing cavity, or a neighbouring cavity, being formed for instance in the surface of a substrate supporting the lasing cavity and any neighbouring cavity.

An external cavity laser (ECL) is another known arrangement which uses wavelength selective feedback to obtain single mode operation. In this case, the lasing cavity is coupled via an end facet to a further cavity, usually in free space, that contains a wavelength-selective feedback mechanism to provide feedback to the lasing cavity. The wavelength-selective feedback mechanism typically comprises individually mounted wavelength-selective optics in the free space. In the ECL, the "lasing" cavity is sometimes described as a "gain" cavity rather than a lasing cavity as the end facet is anti-reflection coated, giving the laser diode the construction of a gain element rather than a laser.

More than one different arrangement is known for providing the wavelength selective feedback. DFB/DBR lasers are generally monolithic, their lasing and feedback sections being fabricated on the same substrate, or hybrid-integrated, their lasing and feedback sections being fabricated on integrated substrates. The wavelength selection mechanism is distributed longitudinally along the optical path of the radiation in a waveguide. In an ECL, the wavelength-selective optics are usually fabricated separately and mounted in relation to the lasing cavity in a separate mounting operation. The wavelength selection in an ECL is generally provided by filtering elements arranged to provide a plane or surface which is transverse to the optical path of radiation from the lasing cavity and plays a part in defining the length of the external cavity, often in free space. Examples are the Littrow and Littman/Metcalf configurations in which a diffraction grating operates in reflection mode and provides a facet in or of the external cavity. The facet may uniquely, or in combination with one or more further feedback elements such as a mirror, define the physical length of the external cavity by providing a discrete change in direction in the optical path.

Lasers are also known which are tunable. Tunable optical sources are required in optical communications systems, cable television systems, local area networks and measurement equipment. For instance in wavelength division multiplexing as used in communications it is necessary to provide optical sources which can operate at distinguishable wavelengths. Although an array of separate devices can be used, each tuned to one of the wavelengths, it becomes expensive to maintain a supply of backup lasers since there has to be a backup laser for every device in the array. In this scenario, it has been recognised that it is preferable to have a tunable laser as backup which can be substituted for some, or indeed any, of the devices in the array. Tunable lasers can also provide significant improvement in local wavelength usage so that optical fibre carriers can be used more flexibly in a communications network with less dependence on centralised intelligence.

In communications, it would be desirable to have a source tunable over the low loss or low dispersion bandwidth windows of an optical fibre for communication. Long distance communication is generally centred on 1310 nm and 1550 nm. In short distance communications such as Local Area Networks (LANs), the equivalent bandwidth window might be centred on 650 nm or 850 nm.

Single mode semi-conductor lasers have been used as tunable sources. For instance, distributed feedback (DFB) lasers have been used but have had a limited tuning range, of the order of 15 nm. This reduces their usefulness in communications. For instance, the International Telecommunications Union (ITU) band of optical channels centred nominally on 1550 nm covers a tuning range of the order of 30 nm.

ECL lasers have also been used as tunable sources. In the Littrow and Littman/Metcalf configurations mentioned above, tuning can be achieved by tilting the grating so that a different wavelength is returned to the lasing section. This determines the wavelength diffracted back to the lasing cavity and thus the lasing wavelength but requires great accuracy in movement. The various moving parts involved in the optical path are difficult to align in manufacture and to maintain through the working life of the laser and the size of the overall configuration can be simply too large for many applications In tunable sources of this general type, in which feedback is provided by reflection or by a diffraction grating operating in reflection mode, "mode hopping" can arise. This is due to the fact that there will be more than one resonant longitudinal mode for the electromagnetic radiation along the optical path in which oscillation is occurring. To prevent mode-hopping, tuning without interruption of the phase of oscillation, or so-called phase-continuous tuning, should be achieved. This can be done by keeping the rate of change of the effective optical cavity length for a laser diode (optical length of the lasing cavity plus the optical length of the external cavity for an ECL) equal to the rate of change of the wavelength of operation. There are known techniques to prevent mode hopping.

In the Littrow and Littman/Metcalf configurations mentioned above, the diffraction grating is a rectilinear grating, constructed as a regular pattern of straight lines. An experimental arrangement using a reflective Fresnel zone plate to feed radiation back to a tunable laser has also been reported, by D T Cassidy and M J Hamp in "Diffractive optical element used in an external feedback configuration to tune the wavelength of uncoated Fabry-Perot diode lasers", Journal of Modern Optics, 1999, V46, No. 7, pages 1071 to 1078. Tuning is provided by mechanical movement of the zone plate along its axis. However, the wavelength separation along the axis of the zone plate was found to be very small, so that the movement of the zone plate had to be extremely accurate, and the arrangement was reported to be prone to mode hopping under changes in current and temperature and when subjected to vibration.

There are various aspects of existing tunable sources which could be improved. There is a trade-off between tunable range and power. Some lasers can be configured to replace any of the lasers in today's 40-channel wavelength division multiplexed communication systems but they won't sustain very long transmission distances. Other lasers deliver the power but are not tunable over a wide enough range. Manufacturing costs can be high as some tunable sources are at the edge of what can be done in semiconductor technology and reliability and control are often a problem as the characteristics of individual lasers vary and every one then has to be characterised for use. Tuning response times can be slow. Further, overall dimensions can be too great. This is often the case where moving parts are involved.

STATEMENT OF THE INVENTION AND ITS ADVANTAGES

In embodiments of the present invention, optical feedback is used to provide wavelength selection in the operation of a laser diode as an optical source, the feedback being provided by a tunable zone plate device.

For instance, according to an aspect of the present invention, there is provided a tunable optical source comprising a laser diode and a feedback element for providing wavelength selective feedback to the laser diode, said feedback element comprising a zone plate device and control means for controlling the wavelength of the feedback to the laser diode, said control means comprising means to apply an electric field to material of the zone plate device.

A zone plate device is a device which provides a non-rectilinear diffraction grating, usually rotationally symmetric, which diffracts incident radiation onto an optical axis through the device. The grating is provided as a pattern or structure which is dimensioned to provide Fresnel zones. For instance, the grating can be a surface relief of nested circular ridges, or rings of varying refractive index.

A particularly convenient form of zone plate device for use in embodiments of the present invention acts as a converging lens, producing an image of incident radiation in a predetermined image plane at a position determined by the focal length of the lens. The focal length of the zone plate device is dependent on the wavelength producing the image. By changing an optical characteristic of the zone plate device, the image at a fixed position can be tuned through different wavelengths. This might be done by modifying the refractive index of material from which the zone plate device is constructed. For instance, if electro-optic material is used in its construction then the refractive index can be modified by applying an electrical field.

The position at which incident radiation is received by the zone plate device can be referred to as an object plane. If the zone plate device is being used to give wavelength selective feedback along an optical path, it will often be preferable that the object and image planes are coincident. For instance, if the zone plate device is directly coupled to a laser diode, it will usually be preferable that the object and image planes coincide at an end facet of the laser diode. In such an arrangement, the zone plate device will be returning a monochromatic image of the output mode spot of the laser diode, back to the laser diode. If the zone plate device is coupled to the laser diode via another component such as a waveguide or coupler, it will usually be preferable that the object and image planes coincide at the interface between the other component and the zone plate device, so that the wavelength selected radiation providing the image is delivered back to the laser diode via the other component.

To avoid problems caused by mechanical instability, since this can affect the precise location of the image plane for the zone plate device for a selected wavelength, it will usually be preferable that the zone plate device is arranged in fixed physical relation to the image plane. This can be achieved by arranging that the image plane is coincident with a surface of the zone plate device.

Embodiments of the present invention have the very significant advantage of being tunable without moving parts.

Examples of electro-optic materials which might be used in a zone plate device in an embodiment of the present invention include strontium barium niobate (SBN), lead lanthanum zirconate titanate ($Pb_{1-x}La_x(Ti_{1-y}Zr_y)_{1-x/4}O_3$ or PLZT), lithium niobate ($LiNbO_3$), lithium tantalate ($LiTaO_3$) and barium titanate ($BaTiO_3$). SBN can be produced in more than one form, the forms having different proportions of strontium and barium but two forms which would each be suitable for use in terms of optical properties are SBN:61 and SBN:75.

The tunable zone plate device may provide at least part of an external cavity in relation to the laser diode. For instance, it may comprise a piece of material, optically transparent at wavelengths of interest, which, in use, is optically coupled to a facet of the laser diode and transmits optical radiation output by the diode to elements of a zone plate. The elements might be constructed as either an amplitude or a phase zone plate.

As mentioned above, the tunable zone plate device might be coupled directly or indirectly to a facet of the laser diode. It may be desirable to incorporate one or more further components, such as a mode hop control device, a waveguide, or a coupler for use in monitoring performance and/or calibration. A waveguide for instance may be used to improve the characteristics of the optical radiation leaving the laser diode for delivery to the zone plate device, such as by increasing the mode spot size. An adiabatically tapered waveguide is particularly suitable for this purpose. Such further component(s) might lie between the laser diode and the zone plate device, or elsewhere in the external cavity.

A mode hop control device can be provided which is constructed to adjust the phase of the optical radiation travelling in the external cavity. For instance, it is possible to construct a waveguide as a mode hop control device using the same principle as the zone plate device. That is, it can also be constructed using a material whose optical performance can be controlled, such as a material whose refractive index can be controlled by means of an electric field. This might be achieved by using for example an electro-optic or thermo-optic material in construction of the waveguide. Conveniently, the waveguide and the zone plate device can be constructed at least in part out of the same block of material, although it may usually be necessary to provide separate electrodes.

The manner in which optical radiation is diffracted by a zone plate device is determined largely or wholly by the design of the zone plate elements and these are commonly rotationally symmetric. Such a design is useful for embodiments of the present invention although other designs might also be used, such as zone plate elements which are elliptical.

Although there may be applications in which a different configuration is useful, if the zone plate device is to be used to give wavelength filtered optical feedback then a convenient configuration is one in which the image plane lies on an axis which is parallel to a physical surface of the zone plate device. This facilitates alignment of the zone plate device with other components. If the zone plate device is rotationally symmetric, the image plane may be centred on the axis of rotational symmetry and the optical paths into and out of the zone plate device might be collinear. A collinear arrangement can have the advantage of simplifying the output collection optics.

As mentioned above, mode hopping can occur during wavelength tuning because at any instant of time a resonance condition is satisfied for more than one longitudinal mode of the laser cavity. This can be dealt with by changing the effective path length synchronously with tuning the wavelength selective feedback. However, another known reason for mode hopping can be mechanical instabilities. Preferably, the zone plate device is mounted in fixed relation to the location at which an image needs to be created since this can substantially reduce, or eliminate, mode hopping due to mechanical instability such as vibration. For instance, if the zone plate device is coupled (for instance butt-coupled) directly to a laser diode, both the laser diode and the zone plate device are mounted on a common substrate. If the zone plate device is coupled to the laser diode via a waveguide, then it is advantageous if the zone plate device and the waveguide are mounted on a common substrate, or fabricated from the same piece of material, and packaged on a common substrate with the laser diode. Fabricating the zone plate device and the waveguide from the same piece of material also has the advantage that positioning of the waveguide relative to the zone plate device can be dealt with in processing the material, for instance using a mask plus etching or lithography, rather than by subsequent mounting arrangements. This makes alignment easier.

It is preferred in general that there is no "free space" in the optical path of radiation leaving the laser diode and returning to it. Hence if the zone plate device provides an external cavity, or part of an external cavity in relation to the laser diode, the cavity is preferably provided entirely in a material other than air. This can reduce the number of interfaces involved and therefore reduces optical losses which otherwise occur due to multiple interfaces.

Further advantages of the zone plate device arise in use. For instance, because there is no refractive lens necessary in the external cavity, the chromatic aberration introduced by a refractive lens, which becomes particularly significant for higher tuning ranges such as more than 20 nm, is avoided. Hence there is no need for optic repositioning over such tuning ranges. The zone plate device in embodiments of the present invention represents a single device taking the place of two: an imaging optic and a frequency selective filter. A reduction in the number of devices will generally provide the advantages of lower optical losses, easier assembly because component alignment is simplified, and significantly reduced overall size and cost.

Although an amplitude zone plate device could be used, the zone plate device preferably carries zone plate elements constructed as a phase zone plate. This provides a significantly higher level of feedback than where the zone plate elements are constructed as an amplitude zone plate.

Embodiments of the invention lend themselves to being array scalable and techniques such as multiple-unit integration and volume manufacturing can be used.

Embodiments of the present invention may be used to provide primary tuning of an optical source. Alternatively, they might be used to provide compensatory tuning to adjust the output of an optical source which might otherwise drift, for instance due to age or temperature changes and the like.

The zone plate device can alternatively be used independently, for instance as a tunable filter or switch. It can be used in reflection or transmission and with a variety of optical inputs, not necessarily from a laser diode.

With an optical input which is collimated (or at least not spreading significantly), the zone plate device can be used to deliver a wavelength selective image at a predetermined location for input to another component.

Alternatively, for instance with a monochromatic input, the zone plate device could be used to switch delivery of monochromatic radiation on and off at a particular location. In this arrangement, an example might be one in which monochromatic radiation is to be coupled from the zone plate device to an optical fibre. The image plane for the monochromatic radiation can be moved onto and off the end of the fibre by changing the refractive index of the zone plate device and this will have the effect of switching delivery of the radiation down the fibre on and off.

According to a second aspect of the present invention, there is provided a tunable optical filter comprising:
 i) a zone plate device for frequency filtering of optical radiation so as to deliver radiation of a selected frequency at a predetermined location; and
 ii) control means for controlling optical performance of the zone plate device to provide said frequency filtering,
wherein said control means comprises means to change the refractive index of material of the zone plate device so as to change the selected frequency at said predetermined location.

In a tunable filter according to an embodiment of the present invention, it should be noted that the body of the device is important as well as the diffractive function provided by the zone plate elements. As described in relation to the tunable optical source above, it is advantageous that the image plane can be located at a position where optical radiation is delivered to or leaves the zone plate device. This reduces the number of interfaces traversed by the radiation, and therefore reduces losses and/or optical aberrations, and also facilitates the physical alignment and/or coupling of the zone plate device in relation to other components. The dimension of the body of the device along the optical path of radiation between the zone plate elements providing diffraction and an image plane in use of the device may be for instance of the order of 250 $\mu$m, 500 $\mu$m or more.

The construction and characteristics of the zone plate device may in general be the same as the construction of a zone plate device for use in a tunable optical source as described above, except that clearly there may be changes necessary if the zone plate device is to be used in different circumstances. For instance, a zone plate device used in transmission will not usually have a reflective coating applied to the diffractive zone plate elements. However, aspects such as the control means may be the same and again may be provided as electrodes applied to the sides of the zone plate device so as to provide an electric field through material of the body of the device. An electro-optic material such as SBN is again suitable for use in the body of the zone plate device.

According to a third aspect of the present invention, there is provided an optical switch comprising a tunable zone plate device.

A tunable zone plate device according to this third aspect of the present invention might have the same general construction as described for other embodiments above, but might be arranged to receive a monochromatic input, in use. In this case, the location of an image, or focal point, of that input can be switched to lie on or off a predetermined plane.

Hence the intensity of radiation at that plane can be switched between two or more levels by switching a voltage to electrodes controlling the refractive index of the zone plate device.

According to a fourth aspect of the present invention, there is provided a method of tuning an optical source, which optical source comprises a laser diode coupled to a zone plate device for providing wavelength selective optical feedback to the laser diode, wherein the method comprises the step of applying an electric field to material of the zone plate device so as to change its optical performance.

Preferably, the step of applying an electric field to material of the zone plate device changes its optical performance so as to change the wavelength at which the zone plate device forms an image in a predetermined image plane.

According to a fifth aspect of the present invention, there is provided a method of tuning an optical filter, which optical filter comprises a zone plate device for frequency filtering of optical radiation so as to deliver radiation of a selected frequency at a predetermined location, wherein the method comprises the step of applying an electric field to material of the zone plate device so as to change its optical performance whereby the frequency selected for delivery at the predetermined location is changed.

It should be noted that use of words or expressions such as "optical" or "light" in this specification is not intended as a limitation to any particular wavelength range, such as a visible or non-visible wavelength range. It should also be noted that the use of words and phrases such as "plane", "image plane" and "object plane" are not intended to imply an aberration-free system or the like but are merely used to indicate a position in the system. Further, the word "comprising" is intended to be broadly interpreted so as to include for instance at least the meaning of either of the following phrases: "consisting solely of" and "including amongst other things".

SPECIFIC DESCRIPTION OF EMBODIMENTS OF THE INVENTION

A tunable optical source will now be described as an embodiment of the present invention, by way of example only, with reference to the accompanying drawings in which:

FIG. 16 shows a contour plot of the tuning range as a function of the length of a zone plate device and tuning voltage for use in the tunable optical source of FIG. 1;

FIG. 17 shows a zone plate device being used as a switch in a further alternative embodiment of the present invention.

It should be noted that none of the dimensions of components or their relationships shown in the Figures is to scale. Apart from the contour plot of FIG. 16, these figures are schematic only.

BROAD PRINCIPLE OF OPERATION

Figure 1:
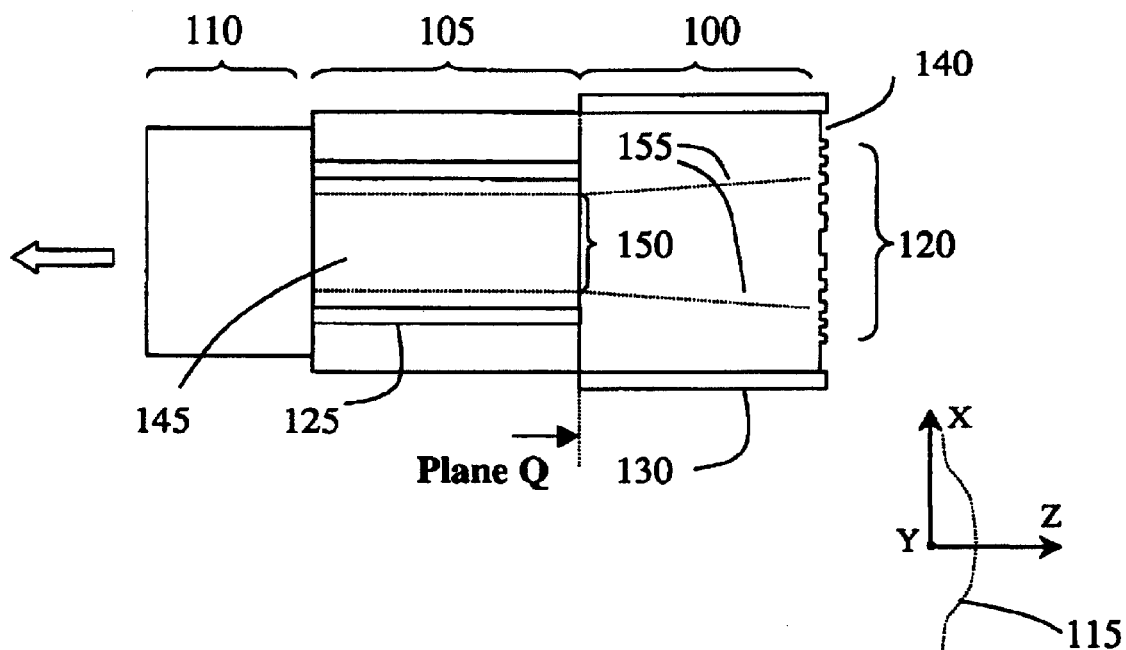
FIG. 1 shows the tunable optical source in plan view.
Figure 2:
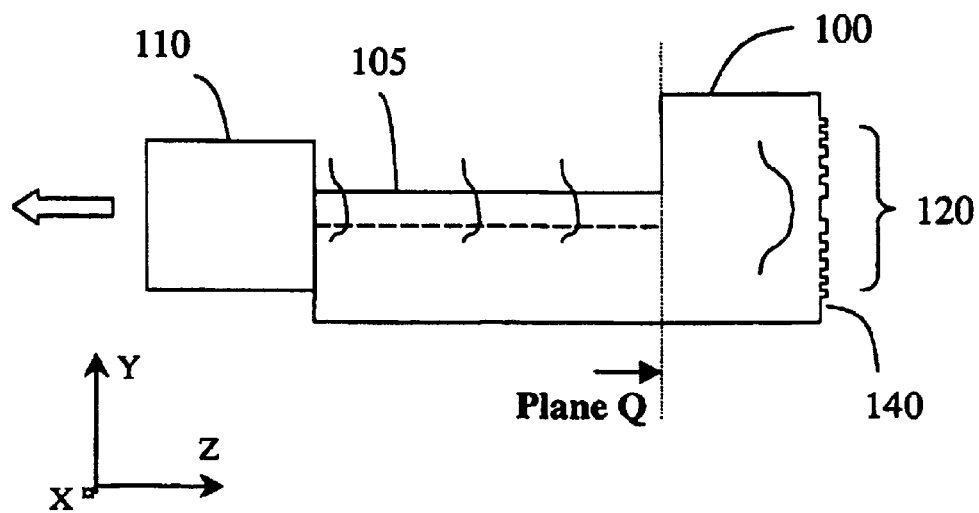
FIG. 2 shows the tunable optical source of FIG. 1, viewed from the side.

Referring to FIG. 1, the broad principle of operation of embodiments of the invention is as follows.

A laser diode 110 is coupled via a waveguide section 105 to a zone plate device 100. The zone plate device 100 returns optical radiation of a selected wavelength to the waveguide section 105. The refractive indexes of both the zone plate device 100 and the waveguide section 105 are controllable. As a result the zone plate device 100 can be used to provide tunable, wavelength-selective feedback to the laser diode 110 and the waveguide section 105 can be used to adjust the external cavity length to ensure dynamic continuous tuning.

The zone plate device 100 receives optical radiation from the waveguide section 105 at plane "Q", where the waveguide section 105 terminates. That is, the mode 150 exiting the waveguide section 105 serves as an optical source for the zone plate device 100. The zone plate device 100 is a device without waveguiding and the mode profile broadens as it propagates towards the far face 140 of the zone plate device 100. This is indicated by the dotted lines 155. In analysis, the intensity profile can be approximately described as elliptical Gaussian and this is shown in one dimension in the curve 115 plotted along the "X" axis of the co-ordinate system.

The far face 140 of the zone plate device 100 is provided with zone plate elements 120 provided as a rotationally symmetric surface relief and the whole far face 140 has a reflective coating. Consequently, the output waveguide mode 150 at plane "Q" is imaged by the zone plate elements 120 at a wavelength dependent position or positions along the optical axis of the zone plate device 100. For one wavelength, the output waveguide mode 150 is imaged exactly back at plane "Q".

It might be noted that the reflective coating may be completely or partially reflective and this is further discussed later in this specification.

Because diffraction occurs only for the selected wavelength to produce an image at plane "Q", that is the wavelength which is fed back to the laser diode 110. If everything else remains constant, changes in the refractive index of the zone plate device 100 will control the wavelength for which an image is formed at plane "Q" and thus control the wavelength fed back to the laser diode 110.

The waveguide section 105 is designed so that optical radiation having a wavelength within the expected tuning range will propagate in the lowest order transverse mode. This prevents the optical performance becoming too "noisy" with multiple modes acting independently.

The waveguide section 105 and the zone plate device 100 are each fabricated using a material whose refractive index "n" can be controlled. One way of doing this is to use an electro-optic material for each of them and to provide electrodes 125, 130 for applying a voltage across the materials. The waveguide section 105 may be required to act as a phase adjuster (or external cavity length adjuster) which ideally controls the external cavity length to satisfy the condition of continuous tuning. Thus dynamic, continuous tuning can be realised.

The waveguide section 105 may alternatively or as well be used to adjust characteristics of the optical mode delivered to the zone plate device 100, such as spot size, or might be part of a coupler for power or wavelength monitoring.

Principle of Operation of a Zone Plate Device 100

Figure 3:
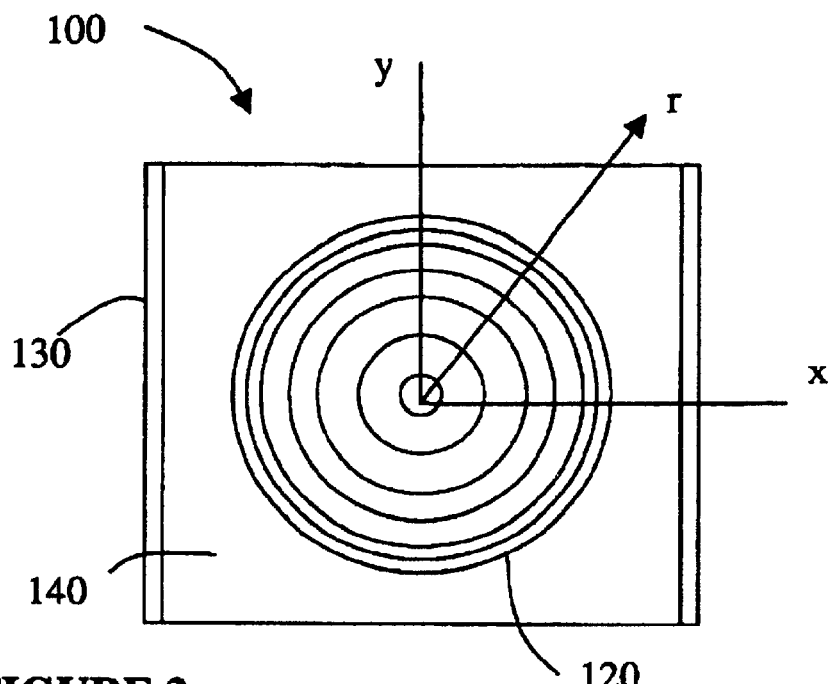
FIG. 3 shows the tunable optical source of FIG. 1, viewed from an end.
Figure 4:
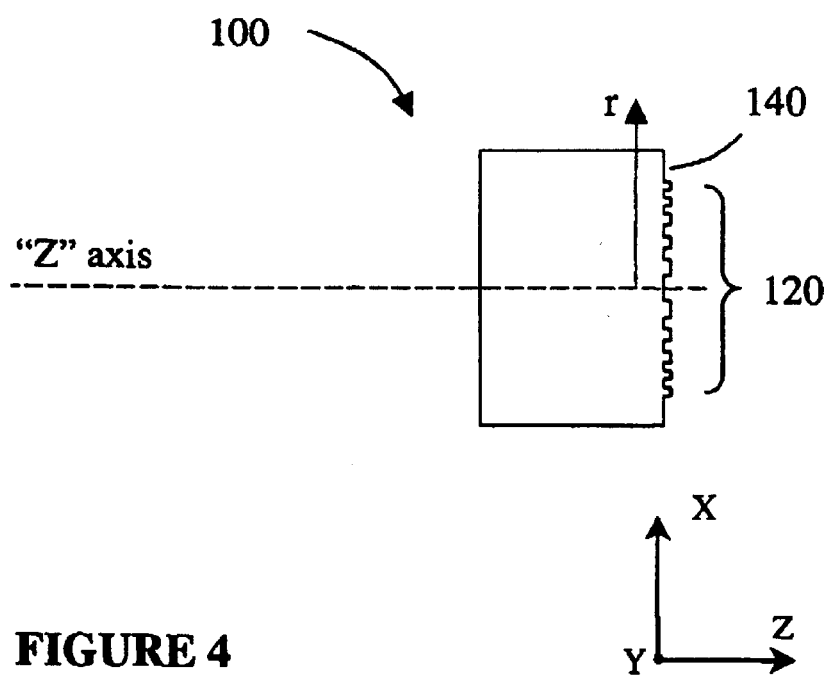
FIG. 4 shows a zone plate device for use in the tunable optical source of FIG. 1, viewed from the side.

Referring to FIGS. 3 and 4, FIG. 3 shows the zone plate device 100 viewed in a direction towards the waveguide section 105 and FIG. 4 shows the zone plate device 100 viewed from the side but not showing the electrodes 130.

The operation of a zone plate device 100 in general is known and is based on diffraction. As mentioned above, there are two types of zone plate, amplitude and phase. In a simple form, both show a rotationally symmetric pattern of rings 120 in a plane of material, usually a facet 140 of a layer of material. The rings 120 behave as a lens with a focal distance which is wavelength dependent. In the amplitude type of device, the rings 120 are usually created by alternating opaque and transparent regions while in the phase type of device, the rings 120 may be created by regions of alternating optical thickness.

In embodiments of the present invention, in both cases a reflective coating is used so that the device 100 returns the diffracted radiation towards the laser diode 110. The coating is not necessarily completely reflective but may be partially reflective, for example to allow optical power calibration to be done.

The following discussion is for the case of a zone plate device 100 illuminated by an optical source from an object plane "Q".

Amplitude Zone Plate Device 100

An amplitude zone plate device 100 is characterized by an amplitude transmission function, $t_A(r)$, as follows:

$$t_A(r) = c_1 \cos\left(\frac{r^2}{2\sigma^2}\right) \cdot P(r) \quad \text{(Equation 1)}$$

where r is a radial distance across the plane measured from the optical axis of the device and thus $r^2=x^2+y^2$;

$c_1$ is an amplitude constant;

σ is a known function for calculating dimensions of the zone plate elements 120 to give a required optical performance of the zone plate device 100 in terms of focal distance over a required wavelength tuning range; and P(r) is a truncation (pupil) function having a value between 0 and 1, defining the physical extent of the device in the plane.

It is preferred that the pupil function, P(r), equals one to maintain the quality of imaging and level of feedback and this can be achieved as long as the outer diameter of the zone plate elements 120 is about three times the optical mode radius in the object plane "Q".

According to basic properties of the amplitude Fresnel zone plate, the amount of feedback (measured as the irradiance of optical feedback at the axial point in plane "Q") provided by an amplitude zone plate device 100 in reflection at a given operational wavelength, λ, will be proportional to the radius "a" of the outermost element of the zone plate elements 120 according to $$I_{A,fb} \propto R a^2$$

where R is the reflectance of the reflective coating.

Referring to FIG. 1, fabrication of the amplitude zone plate device 100 can be accomplished by involved thin-film deposition of concentric annular rings 120 of reflective coating on the exposed surface 140 of the zone plate device 100 in such a fashion that they cover either odd or even Fresnel zones. The whole surface 140 is then over-coated with highly optically absorptive coating.

Phase Zone Plate Device 100

A phase zone plate device 100 is characterized by a phase transmission function, $t_P(r)$, as follows:

$$t_P(r) = c_1 \cos\left(\frac{r^2}{2\sigma^2}\right)\left[1 - e^{i\pi}\right] P(r) \quad \text{(Equation 2)}$$

where the constants and variables maintain their meaning defined above.

A phase zone plate device 100 can be fabricated for example by producing a relief structure in the exposed surface 140 of the zone plate device 100, in accordance with corresponding Fresnel zones. The relief structure has the effect of producing a patterned variation in refractive index. The surface 140 is then coated all over with a reflective coating. This can be done for instance by using thin film deposition methods.

In its simplest form, the zone plate elements 120 of both the amplitude and the phase versions of the zone plate device 100 can be thought of as a rotationally symmetric diffraction grating 120 formed on the substrate that constitutes the body of the device 100, with a grating period that is a function of the distance from its centre. The grating period is such that the constructive interference occurs for a given wavelength at one point along the optical axis of the device 100, effectively producing a focus. If a continuous profile diffraction grating 120 is formed (as compared to the binary profile of a traditional Fresnel zone plate), it is possible to have only first order foci defined via the focal distance, f, and expressed in terms of the free-space wavelength, $\lambda_0$, as $$f = \frac{2\pi}{\lambda_0} n \sigma^2 \quad \text{(Equation 3)}$$

Here n is the index of refraction in the object (or image) space.

Thus, used as an imaging device, the zone plate device 100 will perform as a positive lens with a focal length defined by Equation 3 above.

Advantages of Phase Over Amplitude Zone Plate Devices 100

In embodiments of the present invention, the preferred zone plate device 100 is of the phase type and this is the type shown in the figures. The advantages of the phase zone plate device over the amplitude zone plate device are:

Ease of fabrication

The intensity of optical feedback is at least four times greater. Thus, feedback strength can be controlled over a wider dynamic range by merely depositing a partially reflective coating with different reflectance;

A phase zone plate device can be blazed if necessary (by, for example, making plastic injection molded profile 120). It is not possible to do that with an amplitude zone plate device.

A Tunable Optical Source Using a Phase Zone Plate Device

Figure 5:
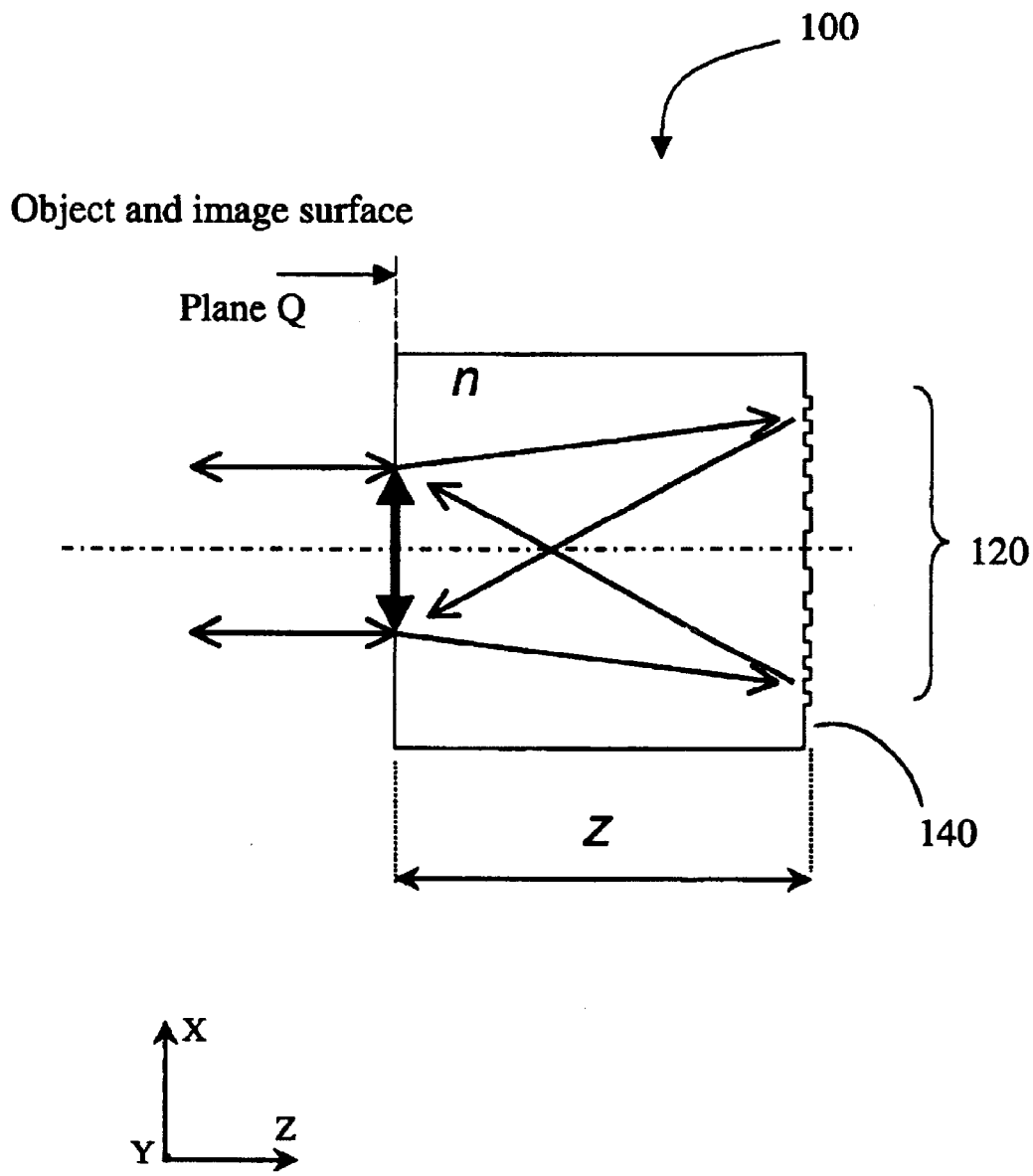
FIGS. 5 and 6 show the optical behaviour of the zone plate device of FIG. 4.

Referring to FIGS. 1 and 5, a tunable optical source according to an embodiment of the present invention incorporates a zone plate device 100 operating as a frequency (or wavelength) selective element that provides optical feedback to a laser diode 110 via a waveguide section 105.

In optical terms, the output facet of the waveguide section 105 which lies in plane "Q" can be thought of as an optical source, or an object, which is to be imaged by the zone plate device 100. The zone plate device 100 will produce optical images which are positioned along the optical axis of the zone plate device 100, in the "Z" direction, according to the wavelength producing the image. Hence wavelength selective feedback is achieved because only one wavelength, for which plane "Q" lies at twice the focal length of the zone plate device 100, will result in an image being formed by the zone plate device 100 just at the distance of plane Q, coincident with the end facet of the waveguide section 105.

In the arrangement shown in FIGS. 1 and 5, the zone plate device 100 is operating in reflection mode. This is achieved by coating the surface 140 of the zone plate device 100 that is remote from the waveguide section 105 with a partially reflective coating. This means the image and object spaces are effectively superimposed.

Figure 6:
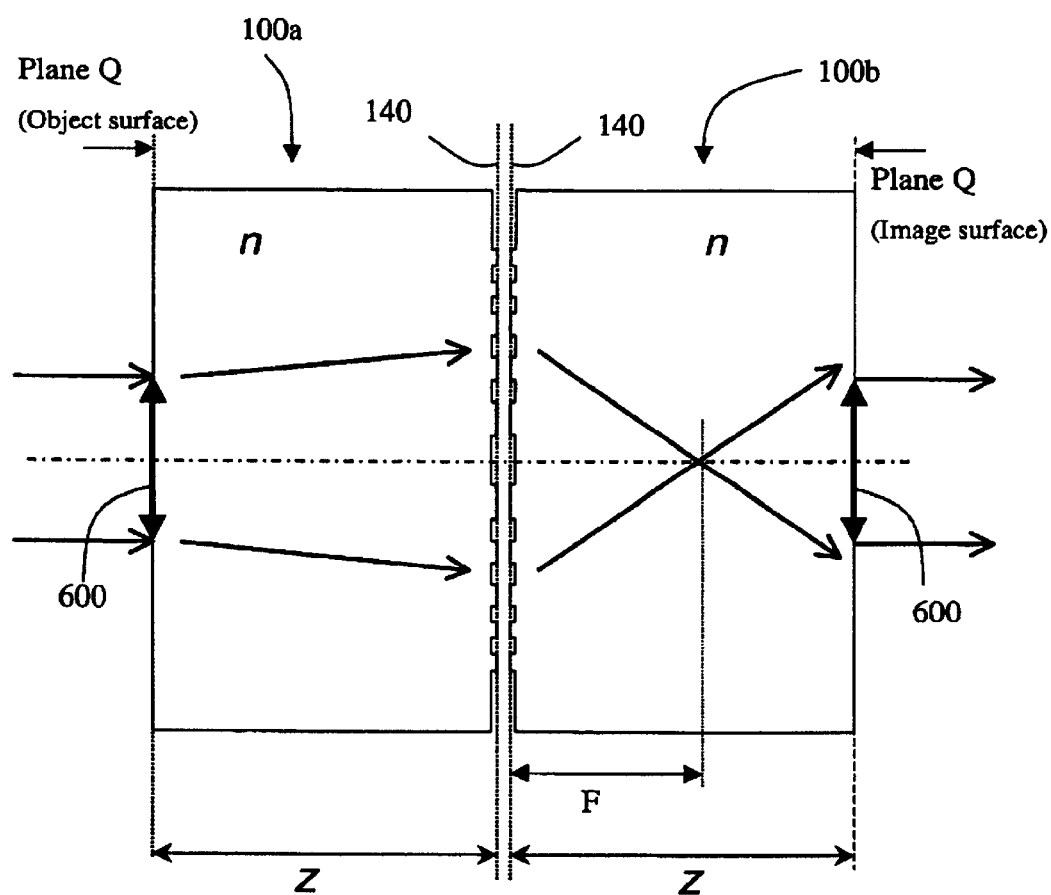

Referring to FIG. 6, the image and object spaces of FIG. 5 can be unfolded in order to clarify a first order analysis of the imaging underlying the operation of the zone plate device 200.

The zone plate elements 120 are arranged in the XY plane perpendicular to the axis of the optical radiation travelling in the zone plate device 100 (Z-axis in FIGS. 5 and 6) and coaxial therewith. For a wavelength of the optical radiation giving a focal length "F" of the zone plate device 100 which is halfway along its "Z" axis, the zone plate elements 120 form an image of the aperture 600 back onto itself with efficiency depending on the partially reflective coating carried by the zone plate elements 120. This results in the required optical feedback at a selected wavelength to the laser diode 110 via the waveguide section 105.

If the refractive index "n" of the zone plate device 100 is changed, then the wavelength for which the aperture 600 is imaged back onto itself is changed and this provides the required tuning.

Importantly in embodiments of the present invention, the physical distance separating the end of the waveguide section 105 from the zone plate elements 120, "Z", does not change during a tuning operation using the tunable source. The imaging properties of the zone plate device 100 are strongly affected by chromatic aberration which means that the position of an image of an optical source is dependent on the wavelength of the optical radiation producing the image. Put another way, as follows from equation (3) above, the optical power of the zone plate device 100 is proportional to the wavelength of optical radiation being selected for feedback. Embodiments of the present invention make use of this aberration to preserve the physical position of an image spot during wavelength tuning, keeping it at the end of the wavelength device 105 which lies in plane "Q", thus providing wavelength selective feedback that does not require any mechanical movement. To tune the overall output of the optical source comprising the laser diode 110, the waveguide section 105 and the zone plate device 100, the refractive index, n, of the material of the zone plate device 100 is varied. This means that there is a change in the wavelength for which plane "Q" lies at twice the focal length of the zone plate elements 120 and thus the wavelength of the optical feedback to the laser diode 110 via the waveguide section 105 changes. Tunability of a zone plate device 100 in an embodiment of the present invention can therefore be provided by modification of the refractive index of material of the zone plate device 100.

A desired physical thickness "Z" of the material between the waveguide section 105 and the zone plate elements 120 is chosen, based on:

- the transverse dimensions of the waveguide mode 150
- the refractive index range of the material of the zone plate device 100,
- the intended wavelength tuning range and remains constant. This thickness is necessarily twice the focal length "f" of the zone plate device 100 achievable over the tuning wavelength range, giving the equation:

$$z=2f=const \tag{Equation 4}$$

The refractive index of material of the zone plate device 100 is then varied in a controllable manner to give Z=2f at any desired wavelength in the tuning range to feed back to the laser diode 110 via the waveguide section 105. This can be done for instance by using an electro-optic material for the body of the zone plate device 100 and applying an electric field to it, using electrodes 130 covering the sides of the zone plate device 100 as shown in FIG. 1. (It would of course also be possible to use alternative means for varying the refractive index, such as applying temperature changes to a thermo-optic material used in the body of the zone plate device 100, as long as a great enough change in refractive index can be achieved.) Variation of refractive index of the material under consideration, $\Delta n$, can be described as:

$$n \rightarrow n'=n+\Delta n \tag{Equation 5}$$

As follows from Equations 3 and 4, the imaging of the end face of the waveguide section 105 that lies in plane "Q" onto itself using the zone plate device 105 in reflection will now be satisfied for the new free-space wavelength, $\lambda_0'=\lambda_0+\Delta\lambda_0$, and the relative change in the wavelength due to the change in refractive index is given by $$\frac{\Delta\lambda_0}{\lambda_0} = \frac{\Delta n}{n} \tag{Equation 6}$$

The waveguide section 105 may be designed to give a parallel-sided waveguide or may provide an adiabatic taper. (Adiabatic waveguides are a known form of component which does not have any abrupt transitions of the waveguide structure along the propagation direction such that an optical field distribution adapts itself gradually to a change in spot size without mode conversion.) The purpose of an adiabatic taper in the waveguide section 105 is to gradually increase the spot size of the mode travelling in it as it reaches plane "Q" and enters the zone plate device 100 while maintaining the single-mode nature of the waveguiding section. The larger the spot size of the radiation in plane "Q", the less it diverges as it propagates through zone plate device 100. This means the zone plate device 100 can be dimensioned so that it is relatively long along the Z axis and relatively narrow in the transverse direction, along the X axis, which facilitates the fabrication and operation of the zone plate device 100.

The material of the zone plate device 100 will provide significant phase adjustment as a result of the change in refractive index during tuning but in some embodiments, this may not be the case, or may not be sufficient. As mentioned above, a purpose of the waveguide section 105 may therefore also or instead be to adjust the phase to facilitate continuous tuning without mode hopping. Radiation leaving the laser diode 110 couples into the waveguide section 105 which is dimensioned to provide single transverse mode propagation over the desired tuning range for the optical source. As described above, the zone plate device 100 returns radiation of a selected wavelength to the waveguide section 105 for transmission back to the laser diode 110. In order to provide continuous tuning without mode hopping, the material of the waveguide section 105 is also selected so that it has a controllable refractive index "$n_{WG}$" and electrodes 125 are provided along its side surfaces to adjust $n_{WG}$ and thus the effective length of the waveguide section 105.

In the arrangement shown in FIG. 1, the waveguide section 105 and the zone plate device 100 together constitute an external cavity with respect to the laser diode 110. A phase-adjustment voltage, $V_p$, is applied to the waveguide section electrodes 125 to adjust the effective length "$L_{eff}$" of the external cavity 105, 100 so as to maintain the requirement for continuous tuning, which is:

$$\frac{\Delta L_{eff}}{L_{eff}} = \frac{\Delta \lambda}{\lambda} \qquad \text{(Equation 7)}$$

Worked Example

Figure 7:
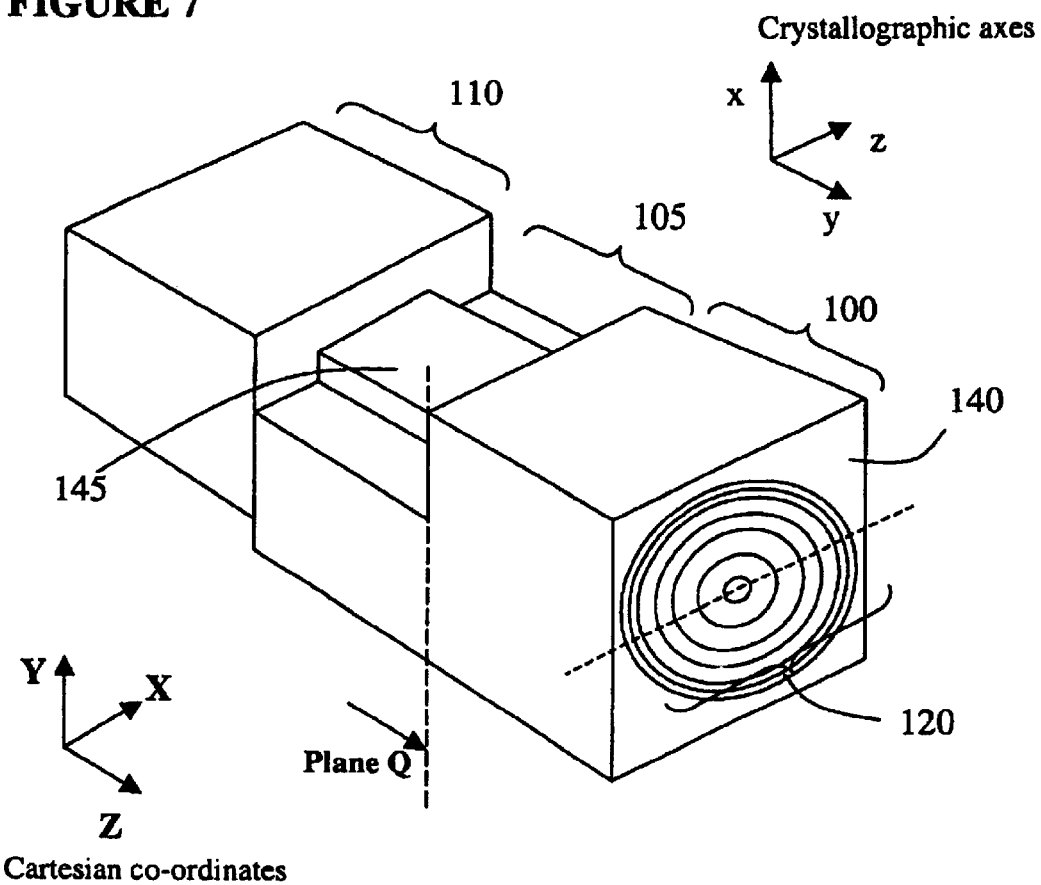
FIG. 7 shows a three quarter view of the tunable optical source of FIG. 1.

Referring to FIGS. 1 and 7, an example of a tunable optical source according to an embodiment of the present invention might be constructed from the following materials and have the following dimensions.

The waveguide section 105 and the zone plate device 100 are constructed using a common x-cut crystal of strontium barium niobate, $Sr_xBa_{1-x}Nb_2O_6$ (SBN), preferably SBN:75, having an electro-optic coefficient of $r_{33}$=1340 pm/V. The refractive index of SBN:75 for light polarised along the "x" and "z" crystallographic axes is $n_1$=2.3122 and $n_3$=2.2981 respectively.

The crystal is oriented in the tunable optical source as shown in FIG. 7 such that the crystallographic axes map respectively onto the Cartesian co-ordinates as follows: x=Y; y=Z; z=X.

Waveguide Section 105

The substrate supports a ridge waveguide 145 and the body of the zone plate device 100 so that the beam delivered by the waveguide section 105 meets the zone plate device 100 in plane "Q" centrally with respect to the zone plate elements 120.

The cross section and materials of the ridge waveguide 145 are generally designed to support a single, transverse, TE polarised mode which has a waist radius in the "X" direction of about 10 $\mu$m for a wavelength range centred on $\lambda_0$=1300 nm and whose intensity distribution can be approximated as elliptical Gaussian. Other cross sections and/or materials might also be found appropriate.

Dimensions such as spot size and waist are all given herein based on the point where intensity drops to a value which is $(1/e^2) I_{max}$ where $I_{max}$ is the maximum intensity. The term "waist" is used in its usual sense as the minimum mode spot size occurring along an optical path. In embodiments of the present invention, the waist for the zone plate device will be measured in plane "Q", at the point where the optical radiation first enters the zone plate device, since the spot size increases from there as the optical radiation passes unguided through the zone plate device 100.

Figure 11:
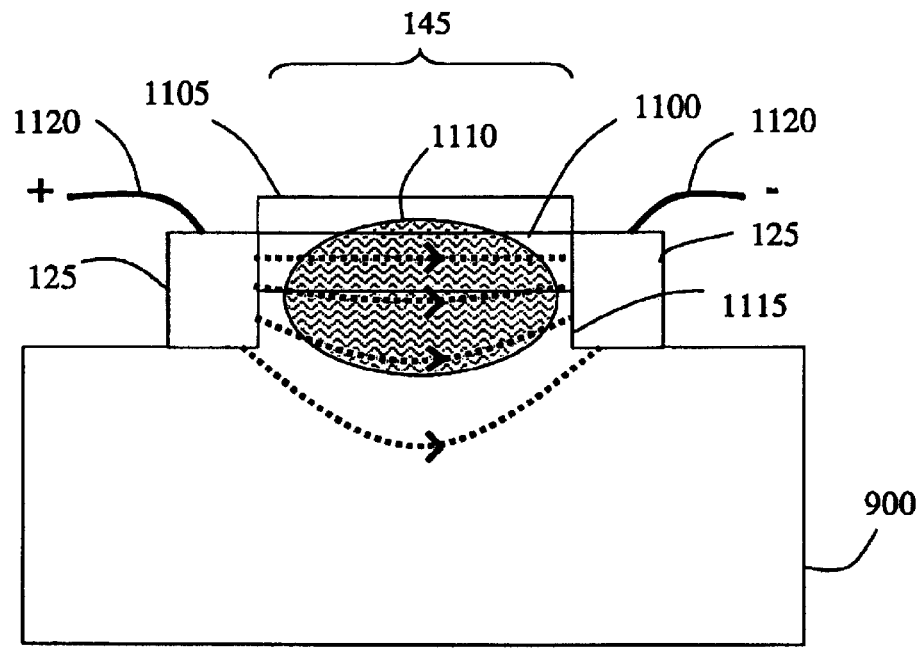
FIG. 11 shows a waveguide section for use in the tunable optical source of FIG. 1, in cross section.

Referring to FIG. 11, the ridge waveguide 145 may comprise firstly a ridge 1115 which is of the order of 2 $\mu$m thick and 25 $\mu$m wide, constructed in the SBN substrate 900. The ridge waveguide 145 comprises secondly a layer 1100 on the ridge 1115, also about 2 $\mu$m thick, of a material having a higher refractive index than the ridge 1115, such as $TiO_2$ or ZnS. Thus the layer 1100 provides the waveguide core and the ridge 1115 provides a lower cladding layer. The ridge waveguide 145 comprises thirdly an upper cladding layer 1105, for example in $SiO_2$, and this can be used to tailor the shape of the mode spot travelling in the ridge waveguide 145 and to provide mechanical protection.

The ridge waveguide 145 is also provided with a pair of electrodes 125, for instance made of nickel and having low resistivity gold pads (not shown) for bonding to external conductors 1120. These may be bonded directly to the ridge waveguide 145 or using a dielectric buffer such as $SiO_2$. The dimensions of the electrodes 125 are such as to cover the sides of all electro-optic material in the ridge waveguide 145 and their thickness is not critical but may be about 1 $\mu$m.

The length of the waveguide section 105, is primarily determined by the needs of the overall opto-mechanical design and might for instance be of the order of 10 mm. If the waveguide section 105 is to be used for phase correction, in an example using SBN:75 as the material of the ridge 145 and a ridge width of 25 $\mu$m, and assuming the overlap between the applied electrical field and the optical mode field to be of the order of 0.3, the modal refractive index change produced by applying a voltage of about 160 V across the ridge 145 would be enough to provide the phase compensation required in wavelength tuning through approximately 10 nm, working in an available tuning range based on 1300 nm central wavelength. However, as discussed elsewhere in this specification, the zone plate device 100 itself can provide phase correction and the waveguide section 105 may not be required for this purpose, or only to make minor corrections.

Figure 12:
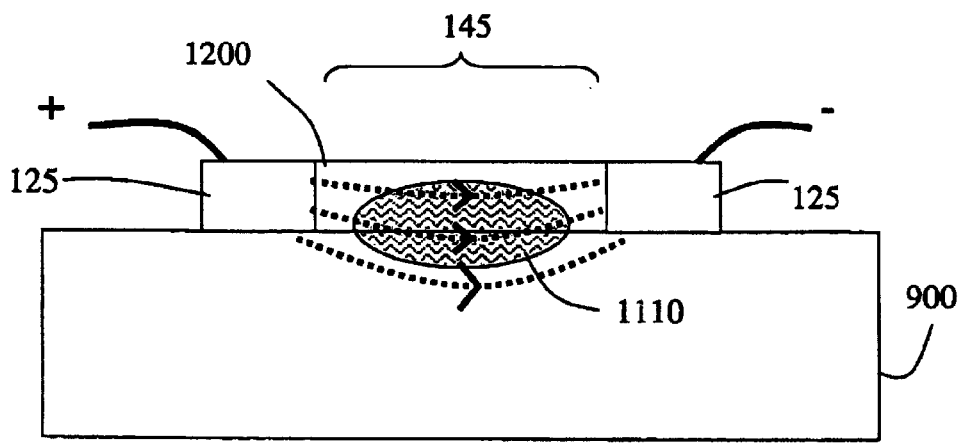
FIG. 12 shows an alternative waveguide section for use in the tunable optical source of FIG. 1, in cross section.
Figure 13:
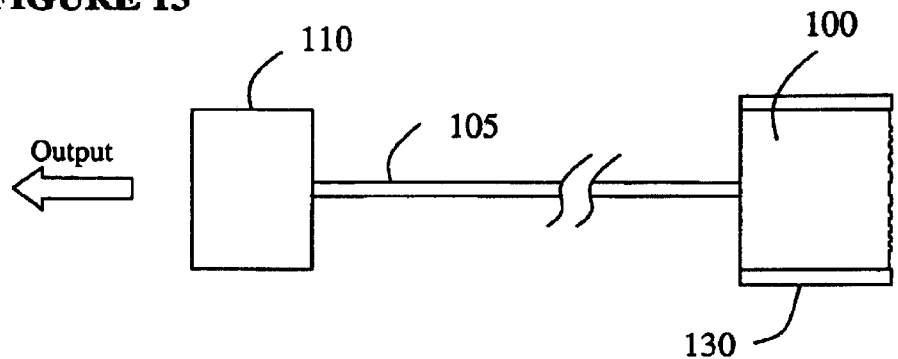
FIGS. 13 to 15 show alternative sets of components and their configurations for providing a tunable optical source according to an embodiment of the present invention, in plan view.

Referring to FIG. 12, in an alternative ridge waveguide 145, the substrate 900 is constructed in SBN:61 and the waveguide core is provided by a ridge 1200 of higher refractive index material such as SBN:75.

In both the above arrangements, as indicated in FIGS. 11 and 12, the ridge waveguide 145 produces an elliptically shaped mode spot 1110 which travels at least partially in the electro-optic material SBN such that the phase of optical radiation forming the beam can be controlled by applying a voltage to the electrodes 125.

Also in both the above arrangements, the core layer 1100 of the ridge waveguide 145 should have a depth of at least 2 $\mu$m in order to provide acceptable waveguiding over the operating wavelength range. If the depth is reduced much below that, there will be improper confinement of the mode.

Referring to FIG. 7, the end facet of the waveguide section 105 which receives optical radiation from the laser diode 110 is anti-reflection coated to maximise transfer of radiation in each direction.

Zone Plate Device 100

The dimensions (in the Cartesian co-ordinate system) of the body of the zone plate device 100 are selected according to the following.

The dimension in the "Z" direction is chosen such that it will equal twice the focal length of the zone plate device 100 over an intended tuning range, taking into account the available range in refractive index of the material of the zone plate device 100 as a result of the available range of voltage which can be applied across it between the electrodes 130.

The dimensions in the "X" and "Y" directions as shown in FIG. 7 need to be about three to four times the spot radius where it meets the zone plate elements 120, to avoid truncation of the optical beam. Because the zone plate device 100 is a bulk device, without waveguiding, the optical radiation diffracts as it propagates from plane "Q" through the zone plate device 100. Thus the dimensions of the zone plate device 100 in the "X" and "Y" directions are determined in part by the length of the zone plate device 100 from plane "Q" to the zone plate elements 120 since the longer it is, the bigger the spot size will become.

For example, if the beam shows a Gaussian mode distribution at 1300 nm that has a waist radius in plane "Q" of $\omega_0 = 10$ μm, then upon propagation in the zone plate device 100 the spot radius will increase to about $\omega \approx 11$ μm over a distance $L_{ZPE} = 250$ μm and to about $\omega \approx 20.5$ μm for $L_{ZPE} = 1000$ μm. Thus the dimensions of the zone plate device 100 in the "X" and "Y" Cartesian directions, for a zone plate device 100 of length 250 μm to 1,000 μm, receiving an input spot radius $\omega_0 \approx 10$ μm, will be of the order of 35 μm to 100 μm.

For a zone plate device 100 having equal dimensions in the "X" and "Y" directions of about 55 μm and length in the "Z" direction of 250 μm, as in the example above, the zone plate elements 120 operating at a wavelength of 1.3 μm will be provided as a surface relief giving about nine Fresnel zones. The outer radius of the ninth zone is about 27.9 μm and the outer radius of the eighth zone is about 26.2 μm. Hence the smallest dimension it is necessary to produce in the surface relief, the "critical dimension", is a ridge or depression having a width of the order of 1 μm or more. The optimal profile depth in the "Z" direction for the zone plate elements 120 for a zone plate device operating in reflection is about 0.5 μm.

Using an SBN:75 substrate, the crystal is oriented such that the crystallographic axes "x", "y" and "z" (equivalent to "1", "2" and "3" in the description given below under the heading "Electro-optic effect") coincide with the Cartesian co-ordinates "Y", "Z" and "X" respectively of the zone plate device 100 shown in FIG. 9.

Electrodes 130 are provided on the side faces of the zone plate device 100. These may be of any suitable material and might comprise for instance nickel, platinum, indium tin oxide or gold. The electrodes 130 cover the whole of each side face of the zone plate device 100 in order to provide an even electrical field in the material in the region in which the optical radiation travels in use. In practice, the electrodes may be deposited on a buffer dielectric layer, for example $SiO_2$.

The zone plate elements 120 carry a high reflectance coating in order to maximise efficiency of the feedback provided to the laser diode 110.

Laser Diode 110

A laser diode 110 suitable for tuning in an embodiment of the present invention comprises a Fabry-Perot semiconductor laser diode 110 which has an end facet with low reflectivity, provided in known manner, for emitting electromagnetic radiation into the external cavity. As described above, the laser diode 110 will emit the radiation into the waveguide section 105. The laser diode 110 is selected to have a wide gain spectrum in a desired wavelength range and might be selected for example to operate over a range centred on 1310 nm or 1550 nm. These are two of the windows within which optical fibres are suited to carry communications signals. Examples of alternatives would be lasers tunable over wavelength ranges centred on 650 nm or 850 nm, also used in communications. Other spectral regions may also be of interest, for instance for non-communications applications.

Any appropriate laser type could be used but a basic requirement is of course that it should be tunable over the necessary range by means of wavelength selective feedback. An example of a laser diode 100 type known for use over wavelength ranges centred on 1310 nm and 1550 nm is an edge emitting double heterostructure, using semiconductor materials from the III-V groups of the Periodic Table, such as GaInAsP/InP. Other examples of suitable known materials for use over various wavelength ranges can be selected from the group $Al_{1-x}Ga_xAs$, $In_{1-x}Ga_xAs_{1-y}P_y$, $Al_xGa_yIn_{1-x-y}P$ and $In_{1-x}Ga_xAs$.

It is necessary to mount the laser diode 110 in relation to the external cavity provided by the waveguide section 105 and the zone plate device 100 and this can be done by using a pre-fabricated platform (not shown), for instance constructed in silicon, which provides any necessary stand-offs, grooves and openings for mutual positioning of the devices as well as vias required for electronic needs. The laser diode 110 is mounted by butt-coupling to the waveguide section 105 in the arrangement described above.

Electro-Optic Effect

SBN is an anisotropic material. The optical properties of anisotropic materials can be described in a coordinate system so as to characterize the optical symmetry of the material. A particular choice of a coordinate system can define so-called "principal dielectric axes" in the material, generally denoted 1,2,3. Operating within that coordinate system, anisotropic material is characterized by the principal refractive indices, $n_i = (n_1, n_2, \text{ or } n_3)$, experienced by light that is linearly polarized along one of the principal axes and that travels along another principal axis.

When an external electric field $E = (E_1, E_2, E_3)$ is applied, that is characterized by field components along principal axes $j = (1, 2 \text{ or } 3)$, to the anisotropic material without inversion symmetry, the refractive indices $n_i$ will change in linear proportion to the components of the applied field, according to the so-called linear electro-optic effect, or Pockels effect. The coefficient of this linear dependence is known as the linear electro-optic coefficient, or Pockels coefficient, "r", represented by a tensor.

The observed change in $n_i$ in response to the field $E_j$ is calculated according to:

$$\Delta n_i(E_j) \approx -0.5 r_{ij} n_i^3 E_j$$

where $r_{ij}$ is a corresponding component of the Pockels coefficient tensor.

Detailed discussion of electro-optic effects can be found in textbooks, including for instance "Fundamentals of Photonics" by B. E. A. Saleh and M. C. Teich, John Wiley & Sons, New York, 1991.

As can be seen from the formula above, by choosing the direction of light propagation through the material (i) and the direction of an applied field (j), it is possible to access a desired electro-optic coefficient for a given material.

To relate the above to the construction of a tunable optical source using an anisotropic material in the zone plate device 100 to control tuning, it is preferable to select a correct orientation of the principal dielectric axes of the electro-optically tunable material in the zone plate device 100 with respect to the optical radiation received from the waveguide section 105. If the orientation is correct, control of the refractive index of the material in relation to the optical radiation can be maximised which in turn maximises the wavelength tunability.

(It should be noted that another factor that may have to be taken into account in selecting a material for a particular embodiment of the invention is the material dependent breakdown voltage, above which the material will no longer behave as a dielectric.)

Polarisation

The diffraction performance of a diffraction device and the electro-optic effect can be affected by the polarization of the incident light. The polarisation of light leaving a laser diode 100 will usually be determined by the orientation of the laser diode 100. It is also possible to control polarisation of the radiation after it has left the laser diode 100, for instance by using a waveplate or other polarising device in the external cavity. In embodiments of the present invention, the preferred polarisation is transverse TE polarisation.

Zone Plate Device 100 in Use

Figure 8:
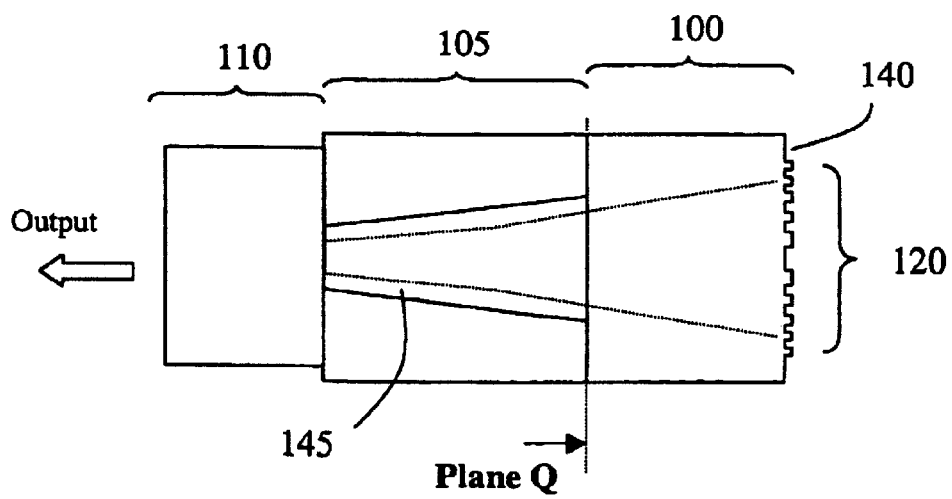
FIG. 8 shows an alternative embodiment of the tunable optical source of FIG. 1, in plan view.

Referring to FIGS. 1, 8 and 16, to use the zone plate device 100, the laser diode 110 is driven in the usual way to produce optical radiation which couples into the waveguide section 105 via the butt-coupled end facets of the laser diode 110 and the waveguide section 105. The waveguide section 105 supports a single transverse propagation mode and guides it to the zone plate device 100. Taking the case of the adiabatically tapered waveguide shown in FIG. 8, at plane "Q" the guided mode shows a waist radius in respect of the zone plate device 100 since it is unguided in the zone plate device 100 and consequently the spot size increases towards the zone plate elements 120. At the surface of the zone plate elements 120, the mode is diffracted back towards the waveguide section 105. For one wavelength the zone plate elements 120 act as a lens with focal distance "F" where "F" is half the length of the zone plate device in the "Z" direction. At this selected wavelength, the mode spot from plane "Q" as object plane is imaged back in plane "Q" as image plane, onto the end of the waveguide section 105. This is returned by the waveguide section 105 to the laser diode 110 and thus provides wavelength selective feedback which tunes the laser diode 110.

Referring to FIG. 16, the selected wavelength is changed by applying a voltage to the electrodes 130 which lie on either side facet of the zone plate device 100. With an arrangement as described above, applying tuning voltages in the range of +/−150 Volts across the 50-micron thick zone plate device 100 will yield about +/−15 nm of wavelength tuning over a range centred at around 1310 nm. Tuning of about +/−20 nm is achievable over a range centred at around 1550 nm.

The tuning ranges shown are calculated according to the relationship:

$$\Delta\lambda = -0.5 r_{33} n^2 \lambda V/d$$

where:

$r_{33}$ is the electro-optic coefficient of the material of the zone plate device 100 in the "X" direction (Cartesian system);

n is the refractive index of the material;

$\lambda$ is the central wavelength (1310 nm as described above);

V is the voltage applied between the electrodes 130; and d is the distance between the electrodes 130 and thus the dimension of the zone plate device 100 in the "X" direction (Cartesian system).

In the arrangement of FIG. 11, the core layer 1100 of the waveguide section 105 is not an electro-optic material but the electro-optic effect is realized by providing interaction between the electric field due to the applied voltage between the electrodes 125 and the tail of the guided mode that penetrates to the lowermost layer 1115 of the ridge waveguide 145. In the arrangement of FIG. 12, direct interaction between the electric field and the electro-optic material of the waveguide core layer 1100 can occur.

Modulation of applied voltages, $V_t$ (to the electrodes 130 of the zone plate device 100 to provide feedback wavelength selection) and $V_p$ (to the electrodes 125 of the waveguide section 105 if necessary to modify the length of the external cavity) can be done independently or synchronised. In practice as mentioned above, the waveguide section 105, or at least the electrodes 125 to the waveguide section 105, may not be necessary. This is very likely to be the case in an embodiment of the invention as shown for instance in FIGS. 7 and 8 in which the zone plate device 100 is being used for feedback to a laser diode 110. In theory, a result of increasing the refractive index of the body of the zone plate device 100 to change the selected feedback wavelength is an increase in optical path length in the zone plate device 100. This occurs at the same rate as the change in feedback wavelength and thus the zone plate device 100 automatically avoids mode hopping by meeting the requirement for continuous tuning. However, in practice or in other configurations or applications of the zone plate device 100, there may be a need for optical path length adjustment.

Alternative Embodiments

In an alternative embodiment, the waveguide section 105 can be provided instead by a length of polarisation-maintaining single-mode fibre (SMF) that is butt-coupled at either end, into the laser diode 110 and the zone plate device 100. The principle of operation remains the same, except that the external cavity length adjustment is now performed by adjusting the length of the fibre, for instance by stretching it in a controlled fashion.

Figure 14:
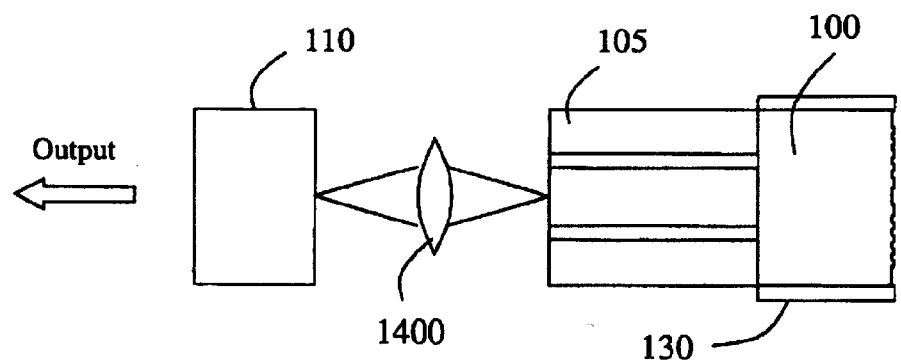

Referring to FIG. 14, instead of butt coupling the waveguide section 105 to the laser diode 110, it is possible to use a lens 1400. For example, if the waveguide section 105 is provided by an optical fibre, the fibre can be provided with a micro-lens at its end, preferably corrected for chromatic aberration.

Figure 15:
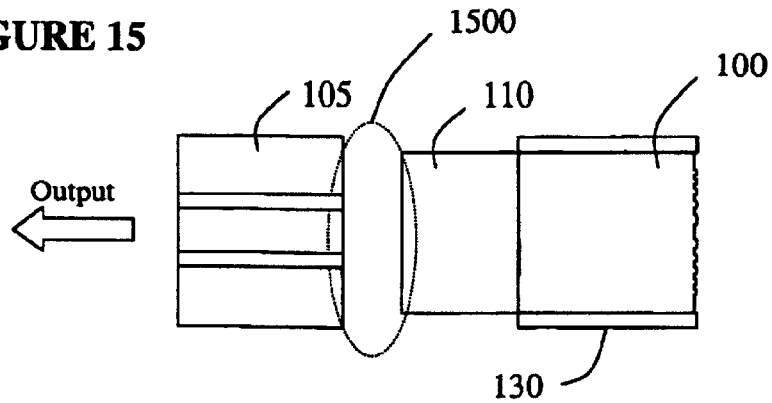

Referring to FIG. 15, it is not necessary to include a waveguide section 105 between the laser diode 110 and the zone plate device 100 at all. Instead, the zone plate device 100 might be butt-coupled directly to the laser diode 110. If it is found necessary to provide phase adjustment in this arrangement, a phase controlling section could instead be provided at the end of the laser diode 110 remote from the zone plate device 100, for instance incorporating an electro-optically tunable waveguide section 105 as described above, or by providing a mirror that is movable in a controlled fashion along the Z-axis, using for instance a micro-electromechanical system (MEMS). The use of an electro-optically tunable waveguide section in this way involves additional complication in packaging but facilitates the use of materials with lower electro-optic coefficients and other properties, thus potentially allowing a range of different fabrication methods to be used for the waveguide section 105, such as diffusion.

Referring to FIG. 17, in an example of a switch configuration, the zone plate device 100 is arranged such that collimated incident radiation is received at the zone plate elements 120 and transmitted through the body of the zone plate device 100 to a focal point. An optical fibre 1700 (or other component) is positioned to pick up radiation leaving the zone plate device 100. In this case, if the incident radiation is monochromatic, it is possible to use the zone plate device 100 to switch between high and low intensities by switching between two voltages to the electrodes 130 on the sides of the device 100. This has the effect of switching the focal point for the incident radiation onto (F at voltage V=0 as shown) and off (F at voltage V≠0 as shown) the end of the fibre 1700. Hence the optical intensity delivered to an optical fibre 1700 whose input facet is placed a predetermined distance from the zone plate device 100 can be switched between high and low levels.

In general, it might be noted that it is not essential that the zone plate device 100 comprises only one material, or only one electro-optic material, although it will usually be preferable that the path of propagation of the optical radiation in the device 100 is through only one material to avoid losses and to simplify fabrication. However, it may be found useful to use another material, for instance to embed a waveguiding property in the zone plate device 100, or to improve conductivity of the electrical field distribution.

Fabrication Aspects

As mentioned above with reference to FIGS. 1 and 7, the waveguide section 105 and the zone plate device 100 are constructed using a common substrate 900 and this is fabricated from an optical quality crystal. This may be for instance SBN:61, SBN:75, PLZT or another suitable material.

Figure 9:
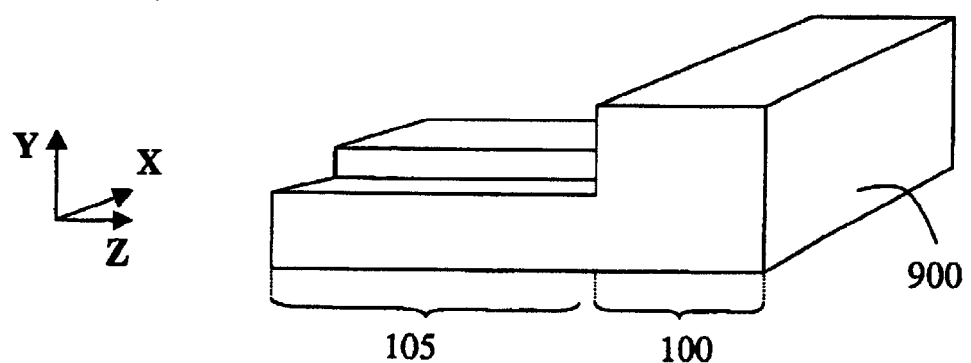
FIGS. 9 and 10 show stages in fabrication of the optical source of FIG. 1, in three quarter view.
Figure 10:
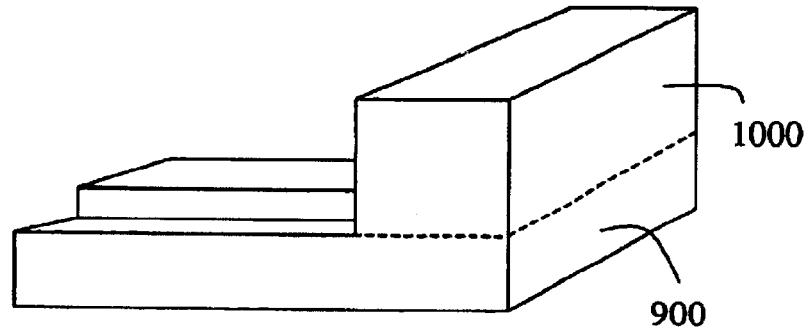

Referring to FIGS. 9 and 10, the crystal used to produce the substrate 900 has an orientation which is for example x-cut, with dimensions of the order of 1 mm, 5 mm and 10 mm along its x, z and y crystallographic axes, respectively. The end face of the crystal which is going to support the zone plate elements is preferably polished to optical specifications, such as to provide a root mean square roughness of less than $\lambda_0/10$, using a technique known in integrated optic technology.

The crystal is then etched to produce the main structure of the zone plate device 100 and the waveguide section 105 as far as the first layer 1115 of the ridge 145. This can be done using high-density plasma etching methods and masks that provide a high etch rate differential between the material of mask and that of the crystal. For instance, a thick (at least 20 $\mu$m) step-contoured mask of dielectric material or metal or a combination of those can be put down using radio frequency sputtering. Then ICP, or inductively-coupled plasma, can be used as one example of a suitable etch method and reference might be made to T. Pandhumsoporn et al, "High etch rate, anisotropic deep silicon plasma etching for the fabrication of microsensors", published in Micromachining and Microfabrication Process Technology II, Austin, Tex., 1996, pp. 94–102. ICP gives a significantly higher etch rate (up to several $\mu$m/min, depending on the materials involved) than dry etching technologies and can typically give dimensional errors less than 1 $\mu$m. An example of a possible high-density plasma approach which provides isotropic etching is inductively-coupled plasma etching in flourine based gases in a pressure range of over 100 mTorr. Other etching methods can also be used, such as reactive-ion etching (RIE).

Referring to FIG. 10, in an alternative approach the main structure of the zone plate device 100 can be produced by bonding two wafers 900, 1000 together with an offset along the Z-axis to form a step at the interface between the parts which will support the waveguide section 105 and the zone plate device 100.

As well as the techniques mentioned above for creating the first layer 1115 of the ridge waveguide 145, ion milling could be used. The core layer 1100 can then be put down using photolithography, thin-film deposition and chemical etching.

In the waveguide section 105 shown in FIG. 12, the core layer 1100 of SBN:75 can be grown epitaxially on the exposed surface of the SBN:61 crystal. A known method is to use excimer short pulse deposition in an oxygen atmosphere at elevated temperatures (~700° C.) followed by etching and repoling if necessary.

Thin film deposition can be used to apply the anti-reflection coating to the end facet of the waveguide section 105 which will be butt-coupled to the laser diode 110. The next stage is to add the core layer 1100 to the ridge waveguide 145. $TiO_2$ or ZnS film can be deposited as the core layer 1100 using deposition, photolithography and chemical etching steps. Known techniques can be used to add the protective layer 1105 to the top of the ridge waveguide 145. The electrodes 125 of the waveguide section 105 can be formed using known lithographic methods.

The next stage is to create the zone plate elements 120 on the rear face of the zone plate device 100. Being a diffractive optical element, fabrication of a phase zone plate device 100 can be accomplished using traditional methods. A surface relief structure 120 can be created with known lithographic techniques using for instance x-rays, electron or ion beams, or etching. Alternatively, holographic or volume zone plate elements 120 could be used. These can also be fabricated using known techniques, such as holographic lithography in which light-sensitive material stores an image created as an interference pattern and recorded as variation in the refractive index. The rotationally symmetric interference pattern necessary to form the zone plate elements 120 is produced by interfering two coherent optical fields, one being a plane wave and another being a spherical wave.

A recently published technique which can be used to fabricate zone plate elements 120 with particularly small dimensions is zone-plate-array lithography (ZPAL), reported by the Nanostructures Laboratory of MIT in their 2001 annual report and published on the Internet at (http://nanoweb.mit.edu/annual-report01/08.html). The resolution of traditional lithographic techniques is limited in practice to about 0.1 $\mu$m. For smaller dimensions, it becomes increasingly costly and difficult. ZPAL however can be used to create structures with even smaller dimensions. In previous semiconductor lithography, the image of a mask is reduced through a lens onto a substrate to define a pattern. In ZPAL, instead of a single lens, an array of hundreds of microfabricated Fresnel-zone-plate lenses is used, each focusing a beam of radiation onto the substrate. A computer-controlled array of micromechanical mirrors turns the beam to each lens on or off as the substrate is scanned under the array, thereby printing the desired pattern in a dot-matrix fashion. No mask is required, enabling designers to change the design of the zone plate elements 120 "on the spot" which is a significant advantage for testing design parameters. As reported, a current ZPAL system operating at a wavelength of 442 nm produces feature sizes of the order of 350 nm but systems are being developed using ultra-violet radiation (UV), including deep and extreme UV, and x-ray wavelengths and thus can potentially provide resolution to just several nanometers.

Once fabricated, the zone plate elements 120 are coated with a high reflectance coating using thin film deposition techniques.

The waveguide section 105 and the zone plate device 100 together form an external cavity for the laser diode 110. In order to couple the laser diode 110 to the external cavity, the end facets of the laser diode 110 and the waveguide section 105 are anti-reflection coated to a level of less than $10^{-4}$ to reduce spurious reflection. The two facets can then be butt-coupled using integration techniques known in opto-electronic packaging.

In practice, regarding the general assembly of components of embodiments of the present invention, photonic device packaging has developed the use of photonic components in multi-chip module (MCM) applications and board-level parallel connections and could be used here. Passive techniques for device to fibre or waveguide and device to substrate alignment and mounting are known which allow a photonic die to be treated akin to electronic chips in an MCM environment. In particular, it is known to use specially constructed alignment features with passive alignment by offset solder bumps and/or robotic chip placement and these can be used to position an edge-emitting laser diode 110 with sub-micron accuracy with respect to the waveguide section 105 or zone plate device 100. Components which extend normal to the surface can be mounted using soldering and/or "flip-chip" attachment. The following publications cover techniques which might be used:

K. P. Jackson, "High-Density, Array, Optical Interconnects for Multi-Chip Modules", Proc. Of IEEE Multi-Chip Module Conference MCMC-92, pp.142–145, 1992.

C. A. Armiento et al, "Gigabit Transmitter Array Modules on Silicon Waferboard", IEEE Trans. On Components, Hybrids, and Manufacturing Tech., v.1, pp.1072–1079, 1992.

Y. C. Lee et al, "Solder Engineering for Optoelectronic packaging", Journal of Metals, v.46, pp.46–50, 1994.

Alternative Materials

Some materials have been described above for use in embodiments of the present invention. However, other materials are available and the following sets out some of the options.

Where the laser diode 110 and the feedback section comprising the waveguide section 105 and the zone plate device 100 are integrated on a platform, the platform might be constructed from ceramics such as aluminium nitride (AlN), berillium oxide (BeO), and $Al_6Si_2O_{13}$ (mullite) that provide good electrical or thermal properties. They are based on a thick-film technology and thus design linewidth/linespacing will be limited to at least 150 $\mu$m. The advantage of using alumina ceramics with gallium arsenide (GaAs)-based laser diodes 110 is a close match in the coefficients for thermal expansion (CTE) for the materials ($CTE_{GaAs} \sim 5.7*10^{-6}$ 1/K, $CTE_{alumina} \sim 6.3*10^{-6}$ 1/K).

Silicon (Si) can alternatively can be used for the platform, for processing Si exploits integrated circuit manufacturing technology with submicron dimensional control. Si also provides higher thermal conductivity than alumina, but the CTE match will not be as good ($CTE_{Si} \sim 2.7*10^{-6}$ 1/K).

The body of the zone plate device 100 and the substrate of the waveguide section 105 can be made of ferroelectric electro-optical materials such as:

strontium barium niobate [SBN:61, $r_{33}$=400 pm/V; SBN:75, $r_{33}$=1340 pm/V]

lead lanthanum zirconate titanate $(Pb_{1-x}La_x(Ti_{1-y}Zr_y)_{1-x/4}O_3$ or PLZT)

lithium niobate ($LiNbO_3$)

lithium tantalate ($LiTaO_3$)

barium titanate ($BaTiO_3$)

The core layer of the waveguide section 105 can be made from one of the ferroelectric electro-optic materials listed above so long as the refractive index is higher than that of the substrate. Other materials which could be used are titanium oxide ($TiO_2$) or zinc sulphide (ZnS) as examples of non-electro-optic materials.

The electrodes of the zone plate device 100 can be constructed in nickel, platinum, indium tin oxide, gold or any other material compatible with suitable deposition techniques.

What is claimed is:

1. A tunable optical device comprising a semiconductor laser diode and a feedback section for providing wavelength selective feedback to the laser diode wherein the feedback section comprises:

i) a zone plate device for delivering optical radiation at a predetermined location for use in said feedback, the zone plate device providing a non-rectilinear diffraction grating which diffracts incident radiation onto an optical axis through the device; and ii) an optical performance controller for controlling optical performance of the grating of the zone plate device, wherein said optical performance controller is adapted to change the refractive index of material of the zone plate device such that the grating controls the wavelength of the optical radiation delivered at said predetermined location.

2. A tunable optical device as in claim 1 wherein the optical performance controller is adapted to apply an electric field to said material of the zone plate device.

3. A tunable optical device as in claim 2 wherein the material of the zone plate device is electro-optic.

4. A tunable optical device as in claim 3 wherein the material of the zone plate device comprises strontium barium niobate.

5. A tunable optical device as in claim 4 wherein the material of the zone plate device comprises SBN:75.

6. A tunable optical device as in claim 1 wherein the zone plate device comprises a piece of said material, the piece of material having zone plate elements on a first facet thereof and said predetermined location coinciding with a second facet thereof.

7. A tunable optical device as in claim 6 wherein the dimension of the zone plate device from the first facet to the second facet is at least 200 microns.

8. A tunable optical device as in claim 6, wherein the optical performance controller comprises electrodes extending from the first facet to the second facet for creating an electric field in the piece of material.

9. A tunable optical device as in claim 1 wherein the zone plate device provides amplitude zone plate elements.

10. A tunable optical device as in claim 1 wherein the zone plate device provides phase zone plate elements.

11. A method of tuning an optical device, which optical device comprises a laser diode optically coupled to a zone plate device having a non-rectilinear diffraction grating for providing wavelength selective optical feedback to the laser diode, wherein the method comprises the step of applying an electric field to material of the zone plate device so as to change the optical performance of the grating so as to change the wavelength at which the zone plate device forms an image in a predetermined image plane.

12. A method of tuning an optical device, which optical device comprises a zone plate device having a non-rectilinear diffraction grating for frequency filtering of optical radiation so as to deliver radiation of a selected frequency at a predetermined location along an optical axis through the device, wherein the method comprises the step of applying an electric field to material of the zone plate device so as to change the optical performance of the grating whereby the frequency selected for delivery at the predetermined location is controlled.

13. A tunable optical device as in claim 1 wherein the zone plate device provides at least part of an external cavity in relation to the laser diode.

14. A tunable optical device as in claim 13 wherein the external cavity is entirely provided in material other than air.

15. A tunable optical device as in claim 13 wherein the zone plate device comprises a piece of material, optically transparent over a range of wavelengths, which, in use, is optically coupled to a facet of the laser diode and transmits optical radiation from the diode to the non-rectilinear diffraction grating, said piece of material providing the material whose refractive index is changed by the optical performance controller so as to control the wavelength of the optical radiation delivered at said predetermined location.

16. A tunable optical device as in claim 15 wherein the non-rectilinear diffraction grating is constructed as variations in refractive index in material of the zone plate device.

17. A tunable optical device as in claim 15 wherein the non-rectilinear diffraction grating is arranged to image incident radiation, the radiation having a selected wavelength, onto a predetermined image plane.

18. A tunable optical device as in claim 17 wherein the incident radiation is received from an object plane and the object and image planes are coincident.

19. A tunable optical device as in claim 17 wherein the zone plate device is arranged in fixed relation to the image plane.

20. A tunable optical device as in claim 17 wherein the image plane is coincident with a surface of the zone plate device.

21. A tunable optical device as in claim 15 wherein the non-rectilinear diffraction grating is rotationally symmetric.

22. A tunable optical device as in claim 1, further comprising a mode hop control device.

23. A tunable optical device as in claim 22 wherein the mode hop control device.

24. A tunable optical device as in claim 23 wherein the optical performance controller comprises electrodes for applying an electric field to material of the waveguide.

25. A tunable optical device as in claim 24 wherein the waveguide is constructed at least in part in electro-optic material and wherein the electrodes are arranged to apply an electric field to the electro-optic material.

26. A tunable optical device as in claim 23 wherein the waveguide is adapted to increase a received spot size of optical radiation for delivery to the zone plate device.

27. A tunable optical device as in claim 26 wherein the waveguide is adiabatically tapered.

28. A tunable optical device as in claim 15 wherein the zone plate device is optically coupled directly to a facet of the laser diode.

29. A tunable optical device as in claim 22 wherein the zone plate device is optically coupled to a facet of the laser diode via the mode hop control device.

30. A tunable optical device as in claim 22 wherein the zone plate device and the mode hop control device are constructed at least in part from a common piece of material.

31. A tunable optical device as in claim 13 wherein the external cavity comprises a waveguide.

32. A tunable optical device comprising:
   i) a zone plate device for delivering optical radiation at a predetermined location along an optical axis through the device, the zone plate device comprising a piece of material having a first facet and a second facet, and providing a non-rectilinear diffraction grating which diffracts incident radiation onto said optical axis; and
   ii) an optical performance controller comprising electrode extending from the first facet to the second facet for creating an electric field in the material for controlling optical performance of the zone plate device wherein said optical performance controller is adapted to change the refractive index of material of the zone plate device by means of said electric field such that the grating switches the optical intensity of the optical radiation delivered at said predetermined location between high and low levels.

33. A tunable optical device as in claim 32 wherein said non-rectilinear diffraction grating is provided at said first facet.

34. A tunable optical device as in claim 32 wherein said predetermined location coincides with said second facet of the zone plate device.

35. A tunable optical device as in claim 32 wherein said piece of material comprises strontium barium niobate.

36. A tunable optical device as in claim 32 wherein said piece of material comprises SBN:75.

* * * * *